United States Patent [19]
Guha et al.

[11] Patent Number: 5,334,423
[45] Date of Patent: Aug. 2, 1994

[54] MICROWAVE ENERGIZED PROCESS FOR THE PREPARATION OF HIGH QUALITY SEMICONDUCTOR MATERIAL

[75] Inventors: Subhendu Guha; Chi C. Yang; XiXiang Xu, all of Troy, Mich.

[73] Assignee: United Solar Systems Corp., Troy, Mich.

[21] Appl. No.: 10,074

[22] Filed: Jan. 28, 1993

[51] Int. Cl.$^5$ .............................................. B05D 3/06
[52] U.S. Cl. .................................. 427/575; 427/578; 427/579; 437/235; 437/238
[58] Field of Search ............ 427/575, 578, 579; 437/233, 238, 234, 235; 118/723 ME, 723 MR

[56] References Cited

U.S. PATENT DOCUMENTS

| | | | |
|---|---|---|---|
| 4,504,518 | 3/1985 | Ovshinsky et al. | 427/38 |
| 4,517,223 | 5/1985 | Ovskinsky et al. | 427/39 |
| 4,721,663 | 1/1988 | Johncock et al. | 430/65 |
| 4,883,686 | 11/1989 | Doehler et al. | 427/38 |
| 5,192,717 | 3/1993 | Kawakami | 437/233 |

Primary Examiner—Roy V. King
Attorney, Agent, or Firm—Howard & Howard

[57] ABSTRACT

High quality semiconductor material is deposited in a microwave energized glow discharge deposition process by energizing a process gas with microwave energy at a power level sufficient to generate a plasma at or near the 100% saturation mode and by impeding access of deposition species to the substrate so as to lower the deposition rate to a value less than that otherwise achieved operating at the 100% saturation mode.

10 Claims, 2 Drawing Sheets

MICROWAVE ENERGIZED PROCESS FOR THE PREPARATION OF HIGH QUALITY SEMICONDUCTOR MATERIAL

FIELD OF THE INVENTION

This invention relates generally to the preparation of semiconductor materials. More specifically, the invention relates to a glow discharge deposition process for the preparation of thin film semiconductor alloy materials. Most specifically, the invention relates to a microwave energized glow discharge deposition process for the preparation of high quality semiconductor alloy materials.

BACKGROUND OF THE INVENTION

Glow discharge deposition is employed for the preparation of thin films of a variety of materials such as semiconductors, insulators, optical coatings, polymers and the like. In a typical glow discharge deposition, a process gas, which includes a precursor of the material being deposited, is introduced into a deposition chamber, typically at subatmospheric pressure. Electromagnetic energy, either AC or DC, is introduced into the chamber and energizes process gas so as to create an excited plasma therefrom. In the plasma, the precursor material is decomposed to create deposition species which deposit a coating on a substrate maintained proximate the plasma region. Frequently, the substrate is heated to facilitate growth of the deposit thereupon. This technology is well known in the art. Early glow discharge deposition processes employed either direct current, a low frequency alternating current or a radio frequency alternating current to energize the plasma. Radio frequency current is still very widely employed for this purpose.

One particular drawback to radio frequency energized glow discharge deposition processes is their relatively low rate of disposition and inefficient utilization of process gas. In an attempt to increase deposition rates and gas utilization, those of skill in the art have turned to the use of microwave energized plasmas. It was found that while microwave energized processes greatly improve deposition rates and gas utilization, materials, particularly semiconductor materials, deposited therefrom were generally of poorer quality than corresponding radio frequency deposited materials. Conventional wisdom heretofore has been that lowered material quality is inherent in microwave energized depositions.

Microwave processes, because of their efficiencies, are quite attractive for the high volume, commercial production of semiconductor devices, particularly photovoltaic devices, and various approaches have been implemented to accommodate the heretofore reduced quality of microwave deposited semiconductor layers. In some instances, multilayered semiconductor devices are manufactured utilizing a mixture of microwave deposited and radio frequency deposited layers, and by an appropriate combination of layers, the effect of reduced material quality is minimized. This approach represents a trade off of device efficiency and the economics of manufacturing; furthermore, the use of both radio frequency and microwave deposited layers in a single device, complicates both the production process and the equipment for its implementation. It would clearly be desirable to improve the efficiency of microwave deposited layers and to avoid the use of mixed microwave/radio frequency depositions in a production mode. Furthermore, it is always desirable to improve the quality of the semiconductor material in devices. In photovoltaic devices, material quality correlates directly with device efficiency; therefore it would be most desirable to have a microwave energized deposition process which produces photovoltaic semiconductor material of a quality which exceeds that of materials deposited by conventional radio frequency processes.

Since the prior art regards microwave deposited semiconductor material as being of lesser quality than radio frequency deposited material, it does not show any methodology whereby a microwave process may be employed for depositing semiconductors having material qualities equal to, or exceeding those of radio frequency deposited semiconductors of corresponding composition. The prior art thus teaches away from the principles of the present invention. For example, U.S. Pat. No. 4,504,518 describes various processes for the microwave energized deposition of semiconductor layers. The depositions are primarily carried out at fairly high rates and it is noted in the patent that a low deposition rate, microwave energized process provides poor quality semiconductor material. U.S. Pat. No. 4,517,223 describes another prior art, microwave energized deposition process. U.S. Pat. No. 4,721,663 describes the preparation of microcrystalline silicon by microwave deposition at a pressure of 0.1 torr at a deposition rate of 20 angstroms per second. None of the foregoing disclose or anticipate the manufacture of very high quality semiconductor material in a microwave energized deposition. The copending U.S. patent application Ser. No. 844,372, filed Feb. 24, 1992, discusses the fact that microwave deposited semiconductor alloys are of low quality compared to radio frequency deposited alloys and describes the manufacture of semiconductor devices by a combination microwave/radio frequency process wherein certain relatively thick layers of the device are deposited by a microwave process and wherein other layers, which are more critical to efficient device function, are prepared by a less efficient radio frequency process.

The present invention provides a method whereby a microwave energized deposition process may be employed to prepare semiconductor material which exceeds the quality of material prepared by a corresponding radio frequency deposition process. The method of the present invention, as will be described in greater detail hereinbelow, controls the plasma composition and deposition rate to enhance the overall quality of the semiconductor material prepared therein. The present invention may be implemented into conventional microwave energized deposition equipment and its use results in the economical manufacture of very high quality semiconductor devices. These and other advantages of the present invention will be readily apparent from the drawings, discussion and description which follow.

BRIEF DESCRIPTION OF THE INVENTION

There is disclosed herein a method for the microwave energized deposition of a high quality semiconductor material. The method includes the steps of: providing a deposition chamber; disposing a substrate in the chamber; introducing a process gas which includes at least one semiconductor precursor material, into the chamber; maintaining the process gas at a preselected pressure; providing a source of microwave power operative to introduce microwave energy into the deposition chamber; energizing the source of microwave power at a level selected to create a plasma from the process gas, which plasma has a concentration of deposition species sufficient to deposit a layer of semiconductor material on the substrate at a first deposition rate; and, controlling access of the deposition species to the substrate so that the actual deposition rate of the semiconductor material onto the substrate is less than the first deposition rate. In one embodiment, the source of microwave power is energized at a level sufficient to operate in the 100% saturation mode when creating a plasma. It is generally preferred that the access of the deposition species to the substrate is controlled so that the deposition rate in the process is in the range of 10–50 angstroms per second.

In particular embodiments, the access of deposition species is controlled by interposing a grid between the plasma and the substrate. The grid may be electrically grounded or biased. In a further embodiment, the plasma may be formed in a subchamber so as to further restrict the access of deposition species to the substrate.

DETAILED DESCRIPTION OF THE INVENTION

In accord with the present invention it has been found that a microwave energized glow discharge deposition process can produce semiconductor materials superior to those produced in a corresponding radio frequency energized deposition if the plasma kinetics and deposition rate of the process are appropriately controlled. Prior art investigations of low deposition rate microwave processes employed low input power and/or dilute gas mixtures to lower the deposition rate, and this approaches produces poor quality semiconductor deposits; hence it has heretofore been held that microwave deposited semiconductor materials are inferior to corresponding radio frequency deposited materials. The present invention marks a break with conventional wisdom insofar as it recognizes that it is possible to produce very high quality semiconductor material by a microwave process. In the process of the present invention, microwave energy is input to a process gas, which is typically maintained at subatmospheric pressure, so as to create an excited plasma therefrom. The plasma includes deposition species which deposit onto a substrate to create a semiconductor layer. In accord with the present invention, the plasma is maintained at a fairly energetic level so as to create a concentration of deposition species sufficient to deposit semiconductor material onto the substrate at a particular and relatively high rate, typically in excess of 50 angstroms per second. The access of the deposition species to the substrate is controlled so as to provide an actual deposition rate which is lower, typically in the range of 10 to 50 angstroms per second. By maintaining a highly energetic plasma, it is assured that the process gas will be fully energized by the microwaves and appropriate deposition species generated therein. By controlling the access of the deposition species to the substrate, it is assured that proper semiconductor film morphology will be developed. That is to say, that depositing film will have a decreased number of microvoids, dangling bonds and other such defects which can interfere with material quality. The surprising finding of the present invention is that materials deposited under such conditions are generally superior to semiconductor materials deposited at the same rate of deposition from a radio frequency energized plasma. It is speculated that the highly energetic conditions in the microwave energized plasma promote the generation of optimum deposition species; and the controlled access of these species to the substrate provides for proper film growth.

Figure 1:
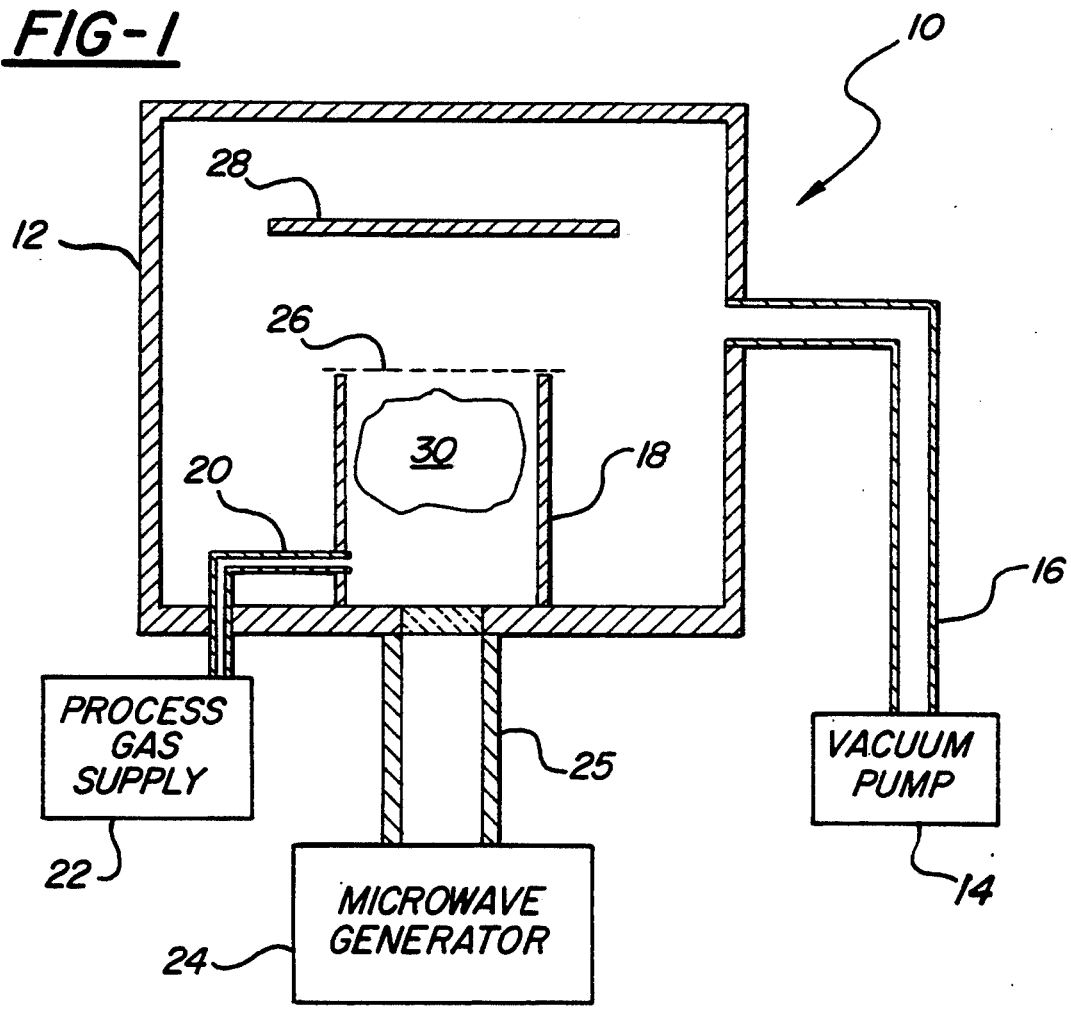
FIG. 1 is a cross-sectional, stylized view of one particular apparatus for carrying out the method of the present invention.

Referring now to FIG. 1, there is shown a cross sectional, stylized view of an apparatus 10 which may be employed to practice the method of the present invention. The apparatus 10 includes a deposition chamber 12 which is environmentally sealable and capable of sustaining a subatmospheric pressure therein. Typically, the chamber is fabricated from stainless steel or the like. The apparatus further includes a vacuum pump 14 which communicates with the chamber 12 by means of an evacuation conduit 16. The vacuum pump 14 and conduit 16 are operative, in combination, to provide and maintain a reduced pressure within the chamber 12.

In this embodiment, the apparatus 10 further includes a subchamber 18 disposed within the deposition chamber 12. The subchamber has a process gas conduit 20 in communication therewith. The process gas conduit 20 is also in communication with a process gas supply 22 and functions to introduce a process gas into the subchamber 18.

The apparatus further includes a microwave generator 24 which operatively communicates with the subchamber 18 by means of a waveguide 25 and a microwave transmissive window 28. The apparatus further includes a grid 26 disposed proximate to one end of the subchamber 18. The grid is typically grounded or electrically biased. The apparatus 10 is operative to deposit a layer of semiconductor material or the like upon a substrate 28 maintained therein and the substrate 28 may be maintained at an elevated temperature by a heater (not shown).

In a typical operation, the substrate 28 is introduced into the deposition chamber 12, the chamber is sealed and pumped to a subatmospheric pressure. In most instances, the chamber is purged with an inert flush gas such as nitrogen or argon in order to facilitate in the removal of oxygen, water vapor and other ambient species therefrom. A process gas is introduced into the chamber 12 via the conduit 20 and subchamber 18. The flow rate of the process gas and the pumping speed of the vacuum pump 14 are adjusted so that a desired operating pressure is maintained in the chamber. In general, microwave deposition processes take place at pressure ranges of approximately 1 millitorr to 1 torr. Once the proper deposition atmosphere has been established, microwave energy is introduced into the chamber through the waveguide 25 and window 28. The microwave energy creates an excited plasma 30 from the process gas in the subchamber 18. The plasma is comprised of various ionized species and radicals derived from the processed gas. These deposition species deposit a layer of semiconductor material on the substrate 28 which is maintained in close proximity to the plasma 30. In most instances, the substrate 28 is heated to facilitate growth of the semiconductor deposit thereupon. In accord with the present invention, the grid 26 is employed to control access of the deposition species in the plasma 30 to the substrate 28. In general, the grid is electrically grounded; although, in some instances, a positive or negative bias may be applied thereto to better control the access of deposition species to the substrate 28.

The composition of the process gas will depend upon the semiconductor material which is being deposited. In those instances where the desired semiconductor is a Group IVa based material such as a silicon alloy material, a germanium alloy material or a silicon-germanium alloy material, the process gas will typically include semiconductor precursor materials such as silane, disilane, silicon tetrafluoride, germane and the like taken either singly or in combination. As is well known in the art, the process gas may further include hydrogen, halogens such as fluorine and other modifying and alloying materials. The process gas may also include inert gasses such as helium or argon; and, if a doped semiconductor is being prepared, the gas mixture will include a dopant precursor therein. The microwave generator 24 is operative to provide energy in the microwave portion of the electromagnetic spectrum, and in one preferred embodiment, the generator is operative to provide energy of 2.45 gigahertz.

It is to be understood that the present invention may be practiced with apparatus other than that illustrated herein. For example, the subchamber 18 may be eliminated and in such instances, control of access of deposition species will depend solely upon the grid 26. In other instances, the grid 26 may be replaced with electrically conductive plates, wires or the like which may be grounded or electrically biased. In other instances, the control of access of deposition species may be accomplished by modification of the subchamber itself, for example by inclusion of a restricted outlet or other such impedance to the passage of deposition species.

EXPERIMENTAL

A series of experiments were run in which similar photovoltaic devices were prepared by radio frequency and microwave glow discharge deposition processes at varying deposition rates. The resultant devices were tested under simulated solar conditions and their performance was taken as indicative of the material quality of the semiconductor layers of the devices.

Figure 2:
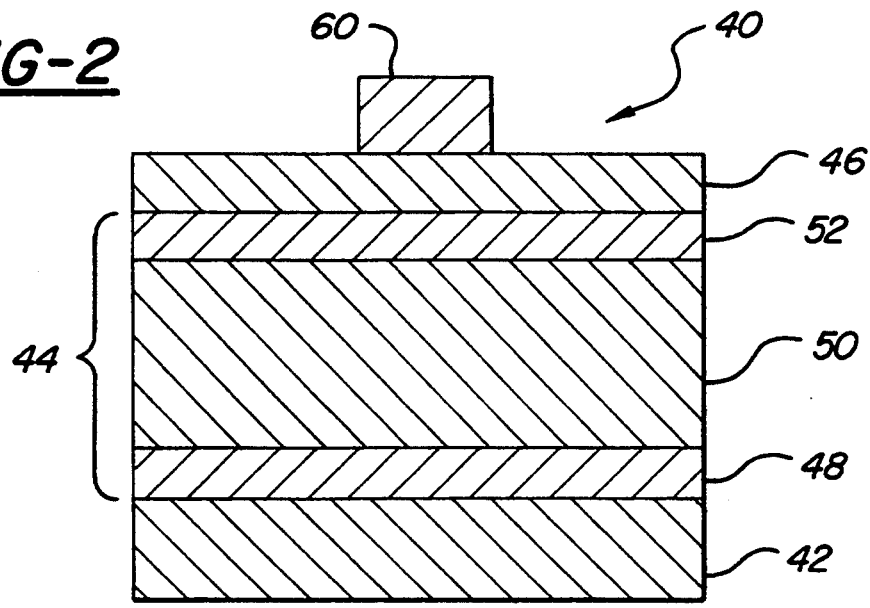
FIG. 2 is a cross sectional depiction of a photovoltaic device manufactured through the use of the present invention.

Referring now to FIG. 2, there is shown a cross sectional view of a photovoltaic device 40 of the type which was employed in this experimental series. The device is of p-i-n type configuration and comprises a triad of photovoltaic layers 44 interposed between a substrate electrode 42 and an upper transparent electrode 46. The substrate electrode 42 comprises a body of stainless steel having a specular reflecting top surface. The triad of semiconductor layers 44 includes first, n-doped, layer 48 comprised of a body of phosphorous doped amorphous silicon-hydrogen alloy material. Atop the n-doped layer is a body of substantially intrinsic, amorphous alloy semiconductor material 50. The layer 50 is described as being "substantially" intrinsic because it may in some instances be of very slightly p or n-type conductivity. Disposed atop the intrinsic layer 50 is a layer of p-doped semiconductor alloy material 52; and in the preferred embodiment, this layer is a layer of microcrystalline, boron doped, silicon-hydrogen alloy material. The top electrode 46 of the device is typically fabricated from a transparent conductive oxide (TCO) material such as indium oxide, tin oxide, zinc oxide or combinations thereof. Finally, the device 40 generally includes a current collecting grid 60 associated with the top electrode 46. The grid 60 is fabricated from a highly conductive material such as a metal foil or a metal paste and serves to collect photogenerated current from the top electrode 46. In accord with the present invention, at least the intrinsic layer 50, of the device 40 is fabricated from a microwave deposited material.

Figure 3:
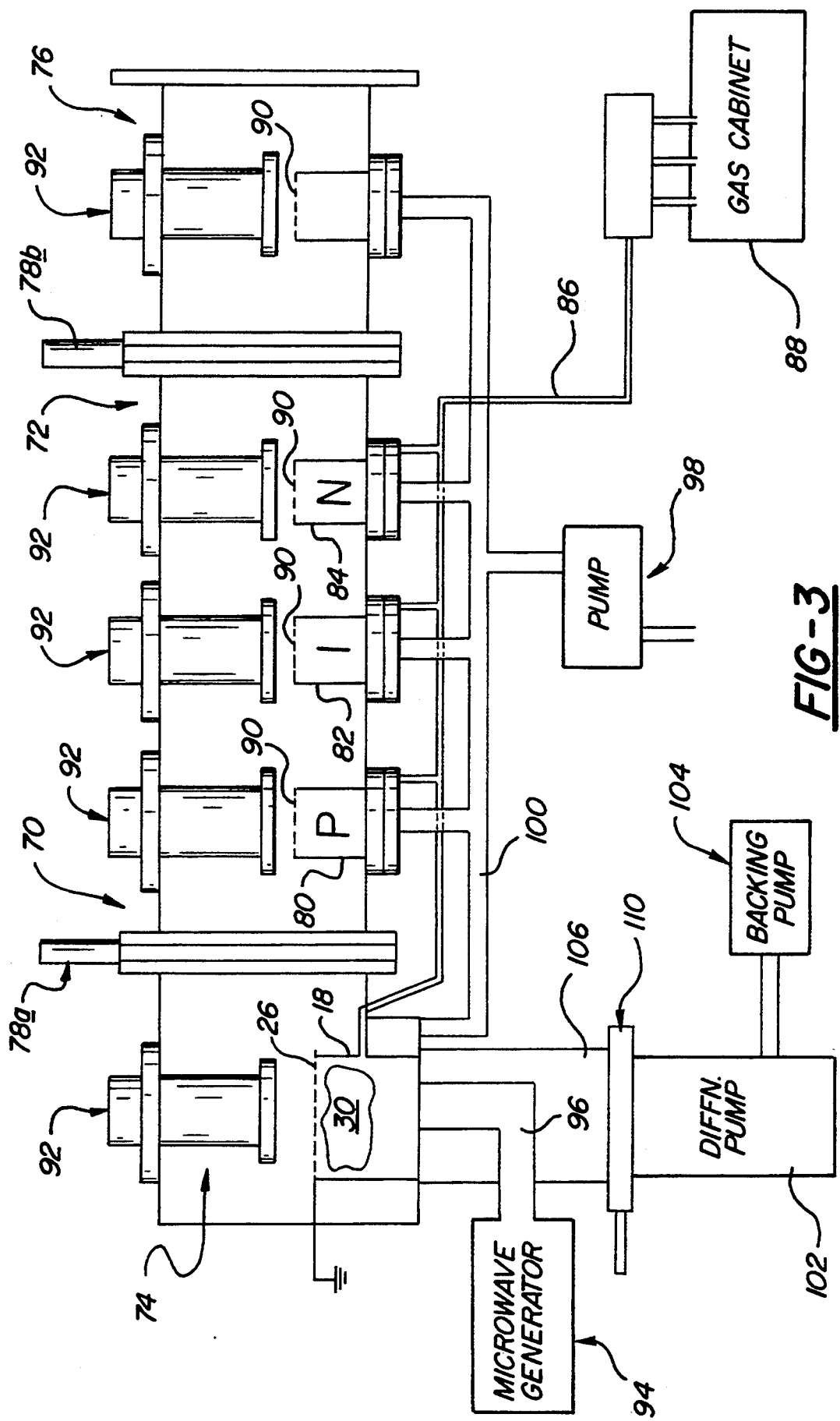
FIG. 3 is a cross-sectional view of an apparatus used to prepare the device of FIG. 2.

FIG. 3 depicts a plasma deposition apparatus 70 which was employed in this experimental series. The apparatus 70 is notable insofar as it includes a radio frequency energized deposition chamber 72 as well as a microwave energized deposition chamber 74. This apparatus 70 may be used for the preparation of semiconductor devices under a variety of conditions. The apparatus 70 further includes a loading chamber 76 for removal and replacement of substrates. Separating the rf chamber 72, microwave chamber 74 and loading chamber 76 are gate valves 78a, 78b; as is well known to those of skill in the art, these valves may be readily opened and closed to allow passage of a very large substrate between adjoining chambers of the apparatus.

The rf chamber 72 includes three separate deposition regions 80, 82 and 84, which are adapted to deposit a p-type, intrinsic and n-type semiconductor layer respectively. Toward that end, each deposition region is provided with a gas supply via a manifolded conduit 86 communicating with a gas supply cabinet 88. Each rf deposition region 80, 82, 84 includes a cathode 90 which is energized by a radio frequency energy via a power supply (not shown). Each rf deposition region 80, 82, 84 further includes a substrate holder and heater assembly 92 which retains and heats a deposition substrate. It will be noted that the loading chamber 76 also includes a substrate heater assembly 92 and further includes a cathode 90. The heater 92 and cathode 90 associated with the loading chamber 76 may be employed to pretreat the substrate as, for example, by plasma cleaning, deposition of other particular layers and the like, as is well known in the art.

The microwave chamber 74 also includes a substrate heater assembly 92 but it will be noted that this chamber 74 includes no cathode assembly. Instead, the microwave chamber 74 is supplied with microwave energy via a microwave generator 94 operatively communicating therewith by a waveguide 96. The microwave chamber 74 further includes a subchamber 18, for enclosing a plasma 30 and further includes a grounded screen 26, as previously described.

The apparatus 70 further includes a process pump 98 operatively communicating with the various chambers via a vacuum conduit 100. It will also be noted that the microwave chamber 74 includes a separate pumping system comprised of a diffusion pump 102 having a backup pump 104 associated therewith and operatively connected to the microwave chamber 74 by a conduit 106 and a gate valve 110. The microwave deposition process typically employs a very high flow rate of process gas and operates in a pressure regime different from the rf energized deposition, and hence the separate pumping system is typically employed to maintain the proper pressure under these dynamic conditions.

In the experimental sequence, a series of devices generally similar to that of FIG. 2, were prepared utilizing both radio frequency and microwave depositions. The first device was prepared utilizing an all radio frequency process. A specular reflecting, stainless steel substrate was placed into the loading chamber 76 and pretreated by exposure to a hydrogen plasma. The gate valve 78b was then opened and the substrate transferred by a conveyor system (not shown) to the n deposition region 84 of rf chamber 72. The apparatus was sealed and an atmosphere comprising 20 sccm of hydrogen, 0.75 sccm of a 1% mixture of phosphine in hydrogen and 0.65 sccm of disilane was flowed through the chamber. The pump was adjusted to maintain a pressure of 1.2 torr in the chamber. The substrate heater was energized to maintain the substrate at a temperature of approximately 250° C. and the gas mixture energized with radio frequency energy of 13.56 MHz. The cathode was approximately 3.5 inches in diameter and a power of 2 watts was applied thereto. Deposition conditions were maintained for approximately 75 seconds at which time a layer of approximately 200 angstroms of n-doped silicon alloy material was deposited onto the substrate.

The substrate bearing the n layer was transferred to the intrinsic region 82 of the chamber 72. An atmosphere of 15 sccm of hydrogen and 15 sccm of silane was flowed through the chamber and the pump adjusted to maintain a pressure of 1.2 torr. The substrate was maintained at a temperature of 250° C. and the cathode energized with radio frequency energy of 13.56 MHz. The cathode was approximately 3.5 inches in diameter and a power of 15 watts was applied thereto. Deposition conditions were maintained for approximately 50 seconds, during which time approximately 1,000 angstroms of intrinsic silicon alloy material was deposited. The deposition rate was approximately 20 angstroms per second.

Following the deposition of the intrinsic layer, the substrate was transferred to the p region 80. An atmosphere of 95 sccm of hydrogen, 2.5 sccm of a 5% mixture of silane in hydrogen and 3.25 sccm of a 2% mixture of BF$_3$ in hydrogen was flowed through the chamber. Pumping speed was adjusted to maintain a pressure of 1.7 torr in the chamber and the substrate was heated to 250° C. The cathode was energized as in the previous deposition and deposition conditions were maintained for a time sufficient to deposit a 200 Angstrom thick layer of p-doped, microcrystalline silicon alloy material.

The completed device was removed from the chamber and a top electrode layer of transparent conductive oxide material was applied by a vacuum evaporation process.

A second device was prepared in the apparatus of FIG. 3. This device was also prepared upon a specular stainless steel substrate and it included n-doped and p-doped layers deposited in accord with the previous example; however, after the n-doped layer was deposited, the substrate was transferred to the microwave chamber 74 and the gas gate thereto closed and sealed the chamber from the remainder of the apparatus.

For this deposition, the grid 26 was removed from the apparatus, consequently there was no impediment to deposition species reaching the substrate. An atmosphere of 30 sccm of silane, and 30 sccm of hydrogen was flowed through the chamber. The pump was adjusted to maintain a pressure of 10 millitorr therein and the substrate heated to 250° C. Microwave energy of approximately 800 watts at 2.45 GHz was introduced into the chamber. Microwave power was maintained for approximately 23 seconds so as to deposit an intrinsic silicon hydrogen alloy layer of approximately 1600 angstroms thickness. The deposition rate was approximately 70 angstroms per second. Following the deposition of the intrinsic layer, the substrate was returned to the p region 80 of the rf chamber 72 and a p-doped layer deposited as in the previous example. The following deposition of the p layer, a top TCO electrode was provided.

A third device was prepared in accord with the procedure of Example 2, except that the grounded grid 26 was interposed in the microwave chamber 74. The process gas composition and power level was as in the previous example except that the deposition rate was approximately 19 angstroms per second and deposition conditions were maintained for approximately 100 seconds so as to deposit an intrinsic layer of 1950 angstroms thickness.

The thus prepared devices were tested by exposing them to simulated AM 1.5 solar illumination, and measuring their electrical output. The results of the test are summarized in the table herein below:

TABLE

| Sample | Dep. Rate A/Sec | P Max mW/cm$^2$ | Jsc mA/cm$^2$ | FF |
|---|---|---|---|---|
| 1 (R.F.) | 20 | 4.52 | 6.98 | .70 |
| 2 (Microwave) | 70 | 4.36 | 6.86 | .65 |
| 3 (Microwave) | 19 | 5.41 | 8.13 | .71 |

Among the measured parameters were: maximum power output by the cell, in terms of milliwatts per square centimeter of active area; short circuit current, in terms of milliamps per square centimeter of active area; and fill factor. As is well known in the art, fill factor is a figure of merit which measures the amount of usable power which can be extracted from a device and is derived from the current voltage characteristic curve of the device. A fill factor of 1.0 is the ideal and fill factors are taken to be a good indication of the overall material quality of the intrinsic layer of a photovoltaic device.

It will be seen from the data that the overall performance of Sample 3, which included an intrinsic layer deposited at 19 angstroms per second in a microwave process, is better than the performance achieved by the device of Sample 2 which was identical except that the intrinsic layer was deposited by microwave energy at 70 angstroms per second. It is also notable that the Sample 3 device exceeded the performance of the Sample 1 device which included an intrinsic layer prepared in a radio frequency energized process at a deposition rate of 20 angstroms per second. It will thus be seen that through the use of the present invention, microwave deposited materials may be prepared having material qualities which exceed those of corresponding radio frequency prepared materials.

The present invention provides for an improved method wherein high quality semiconductor material may be prepared in a microwave energized process by generating an energetic plasma, at or near the 100% saturation mode and restricting the access of energetic deposition species to the substrate so as to lower the deposition rate. In this manner, optimum plasma kinetics for the manufacture of high quality semiconductor material are achieved together with optimum growth conditions for low defect films. Within the context of this disclosure, the 100% saturation mode means that the process gas is fully ionized.

It should be appreciated that the present invention may be practiced in manners other than those illustrated herein, provided the proper plasma kinetics and growth rate are achieved. In view of the foregoing, it is to be understood that the drawings, discussion and description presented herein are not meant to be limitations upon the practice of the present invention but are merely meant to be illustrative thereof. It is the following claims, including all equivalents, which define the scope of the invention.

We claim:

1. A method for the microwave energized deposition of a non-polycrystalline semiconductor material, said method including the steps of:
    providing a deposition chamber;
    disposing a substrate in said deposition chamber;
    introducing a processing gas including at least one semiconductor precursor material, into said chamber;
    maintaining said processing gas at a pressure;
    providing a source of microwave power to introduce microwave energy into said deposition chamber;
    energizing said source of microwave power at a level selected to create a plasma from said processing gas, at the 100% saturation mode, said plasma having a concentration of deposition species sufficient to deposit a layer of semiconductor material on said substrate at a first deposition rate; and
    controlling access of said deposition species to said substrate so that the actual deposition rate of the semiconductor material onto said substrate is less than said first deposition rate.

2. A method as in claim 1, wherein the step of controlling access of said deposition species to said substrate comprises controlling access so that the actual deposition rate is in the range of 10–50 angstroms per second.

3. A method as in claim 1, wherein the step of controlling access of said deposition species comprises interposing a grid between said plasma and said substrate.

4. A method as in claim 3, wherein said grid is grounded.

5. A method as in claim 3, wherein said grid is electrically biased.

6. A method as in claim 1, wherein the step of controlling access of said deposition species to the substrate comprises forming said plasma in a subchamber.

7. A method as in claim 1, wherein the step of maintaining said processing gas at a pressure comprises maintaining said gas at a pressure in the range of 1 millitorr to 1 torr.

8. A method as in claim 1, wherein the step of introducing a processing gas comprises introducing a gas including a Group IVa semiconductor precursor material.

9. A method as in claim 8, wherein said semiconductor precursor gas includes a member selected from the group consisting of silane, disilane, germane, silicon tetrafluoride, and combinations thereof.

10. A method for the microwave energized deposition of a non-polycrystalline semiconductor material, said method including the steps of providing a deposition chamber;
    disposing a substrate in said chamber;
    introducing a processing gas, including at least one semiconductor precursor material, into said chamber;
    maintaining said processing gas at a pressure;
    providing a source of microwave power to introduce microwave energy into said deposition chamber;
    energizing said source of microwave power so as to create a plasma from said processing gas at a 100% saturation mode, said plasma including a concentration of deposition species therein sufficient to deposit a layer of semiconductor material on said substrate at a first deposition rate which is greater than 50 angstroms per second; and
    controlling the access of said deposition species to said substrate so that the actual deposition rate of the semiconductor material onto said substrate is in the range of 10–50 angstroms per second.

* * * * *